United States Patent
Pen et al.

(10) Patent No.: US 9,763,327 B2
(45) Date of Patent: Sep. 12, 2017

(54) SELECTIVE SEGMENT VIA PLATING PROCESS AND STRUCTURE

(71) Applicant: Multek Technologies Ltd., San Jose, CA (US)

(72) Inventors: Kwan Pen, Guandong (CN); Pui Yin Yu, Tsuen Wan (HK)

(73) Assignee: Multek Technologies Limited, San Jose, CA (US)

( * ) Notice: Subject to any disclaimer, the term of this patent is extended or adjusted under 35 U.S.C. 154(b) by 0 days.

(21) Appl. No.: 14/834,180

(22) Filed: Aug. 24, 2015

(65) Prior Publication Data

US 2016/0278207 A1    Sep. 22, 2016

(30) Foreign Application Priority Data

Mar. 19, 2015    (CN) .......................... 2015 1 0121886
Mar. 23, 2015    (CN) .......................... 2015 1 0127856

(51) Int. Cl.
*H05K 1/11*    (2006.01)
*H05K 1/02*    (2006.01)
(Continued)

(52) U.S. Cl.
CPC ........... *H05K 1/115* (2013.01); *H05K 1/0216* (2013.01); *H05K 3/0058* (2013.01); *H05K 3/06* (2013.01); *H05K 3/181* (2013.01); *H05K 3/188* (2013.01); *H05K 3/42* (2013.01); *H05K 3/422* (2013.01); *H05K 3/424* (2013.01); *H05K 3/429* (2013.01);
(Continued)

(58) Field of Classification Search
CPC .............. H01L 23/5226; H05K 1/0206; H05K 1/0221; H05K 1/0222; H05K 1/0225; H05K 1/0251; H05K 1/112; H05K 1/114; H05K 1/115; H05K 1/116; H05K 2201/09063; H05K 2201/09072; H05K 2201/0919; H05K 2201/092; H05K 2201/095; H05K 2201/09518; H05K 2201/09527; H05K 2201/09536; H05K 2201/09545; H05K 2201/09554; H05K 2201/09581; H05K 2201/096; H05K 2201/09609;
(Continued)

(56) References Cited

U.S. PATENT DOCUMENTS 4,338,149 A    7/1982    Quaschner
5,116,440 A    5/1992    Takeguchi
(Continued)

OTHER PUBLICATIONS

Non-Final Office Action dated Nov. 1, 2016; U.S. Appl. No. 14/834,205, filed Aug. 24, 2015, applicant; Kwan Pen, 22 pages.
(Continued)

*Primary Examiner* — Ishwarbhai B Patel
(74) *Attorney, Agent, or Firm* — Haverstock & Owens LLP (57) ABSTRACT

A selective segment via plating process for manufacturing a circuit board selectively interconnects inner conductive layers as separate segments within the same via. Plating resist is plugged into an inner core through hole and then stripped off after an electroless plating process. Stripping of the electroless plating on the plating resist results in a plating discontinuity on the via wall. In a subsequent electroplating process, the inner core layer can not be plated due to the plating discontinuity. The resulting circuit board structure has separate electrically interconnected segments within the via.

16 Claims, 6 Drawing Sheets (51) Int. Cl.
*H05K 3/42* (2006.01)
*H05K 3/46* (2006.01)
*H05K 3/00* (2006.01)
*H05K 3/06* (2006.01)
*H05K 3/18* (2006.01)

(52) U.S. Cl.
CPC ......... *H05K 3/4623* (2013.01); *H05K 3/4638* (2013.01); *H05K 3/4602* (2013.01); *H05K 2201/095* (2013.01); *H05K 2201/09545* (2013.01); *H05K 2201/09554* (2013.01); *H05K 2201/10303* (2013.01)

(58) Field of Classification Search
CPC ......... H05K 2201/09618; H05K 2201/09627; H05K 2201/09636; H05K 2201/09809
See application file for complete search history.

(56) References Cited

U.S. PATENT DOCUMENTS

| | | | |
|---|---|---|---|
| 5,121,297 A | 6/1992 | Haas | |
| 5,175,047 A | 12/1992 | McKenney | |
| 5,206,463 A | 4/1993 | DeMaso | |
| 6,541,712 B1* | 4/2003 | Gately | H05K 1/115 174/258 |
| 7,322,833 B1 | 1/2008 | Hakansson | |
| 8,222,537 B2* | 7/2012 | Dudnikov, Jr. | H05K 1/0257 174/256 |
| 8,230,592 B2 | 7/2012 | Kuczynski et al. | |
| 8,302,301 B2 | 11/2012 | Lau | |
| 8,063,316 B2 | 2/2013 | Tam et al. | |
| 8,385,073 B2 | 2/2013 | Tam et al. | |
| 8,525,646 B2 | 9/2013 | Tamm et al. | |
| 8,667,675 B2 | 3/2014 | Dudnikov, Jr. | |
| 9,053,405 B1 | 6/2015 | Liu et al. | |
| 9,092,712 B2 | 7/2015 | Kroener et al. | |
| 9,117,991 B1 | 8/2015 | Olson et al. | |
| 9,338,899 B2 | 5/2016 | Lee | |
| 2007/0117261 A1 | 5/2007 | Ueno | |
| 2012/0181074 A1 | 7/2012 | Ishihara | |
| 2012/0234587 A1* | 9/2012 | Nakamura | H05K 1/115 174/260 |
| 2014/0262455 A1 | 9/2014 | Iketani | |
| 2015/0376444 A1 | 12/2015 | Saito | |

OTHER PUBLICATIONS

Non-Final Office Action dated Nov. 1, 2016; U.S. Appl. No. 14/834,205, filed Aug. 24, 2015, applicant: Kwan Pen, 22 pages.

* cited by examiner

SELECTIVE SEGMENT VIA PLATING PROCESS AND STRUCTURE

CROSS-REFERENCE TO RELATED APPLICATION(S)

This application claims priority under 35 U.S.C. §119(a)-(d) of the Chinese Patent Application No: 201510127856.X, filed Mar. 23, 2015 and titled, "SELECTIVE SEGMENT VIA PLATING PROCESS AND STRUCTURE," and the Chinese Patent Application No: 201510121886.X, filed Mar. 19, 2015 and titled, "SELECTIVE SEGMENT VIA PLATING PROCESS AND STRUCTURE," which are both hereby incorporated by reference in their entireties for all purposes.

FIELD OF THE INVENTION

The present invention is generally directed to printed circuit boards. More specifically, the present invention is directed to printed circuit boards having selective segment via plating.

BACKGROUND OF THE INVENTION

A printed circuit board (PCB) mechanically supports and electrically connects electronic components using conductive traces, pads and other features etched from electrically conductive sheets, such as copper sheets, laminated onto a non-conductive substrate. Multi-layered printed circuit boards are formed by stacking and laminating multiple such etched conductive sheet/non-conductive substrate laminations. Conductors on different layers are interconnected with plated-through holes called vias.

Figure 1:
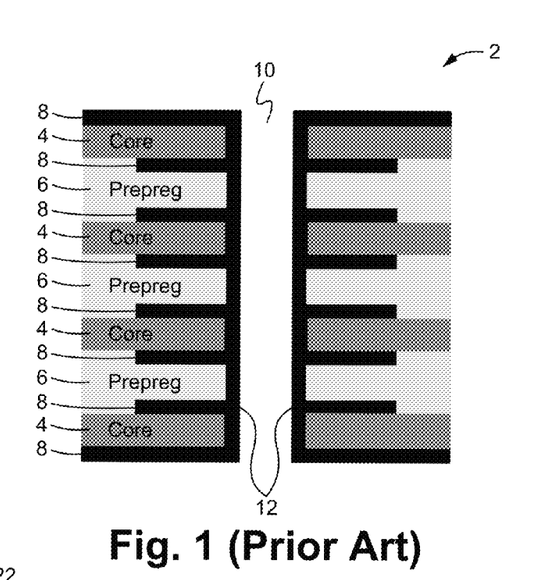
FIG. 1 illustrates a cut out side view of a portion of a conventional printed circuit board.

FIG. 1 illustrates a cut out side view of a portion of a conventional printed circuit board. The printed circuit board 2 includes a plurality of stacked layers, the layers made of non-conductive layers 4, 6 and conductive layers 8. The non-conductive layers can be made of prepreg or base material that is part of a core structure, or simply core. Prepreg is a fibrous reinforcement material impregnated or coated with a thermosetting resin binder, and consolidated and cured to an intermediate stage semi-solid product. Prepreg is used as an adhesive layer to bond discrete layers of multilayer PCB construction, where a multilayer PCB consists of alternative layers of conductors and base materials bonded together, including at least one internal conductive layer. A base material is an organic or inorganic material used to support a pattern of conductor material. A core is a metal clad base material where the base material has integral metal conductor material on one or both sides. A laminated stack is formed by stacking multiple core structures with intervening prepreg and then laminating the stack. A via 10 is then formed by drilling a hole through the laminated stack and plating the wall of the hole with electrically conductive material, such as copper. The resulting plating 12 interconnects the conductive layers 8.

Figure 2:
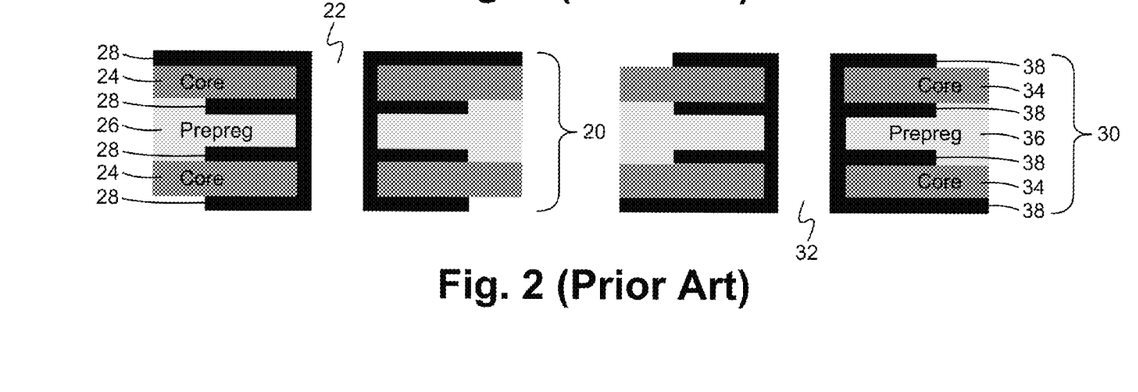
FIG. 2 illustrates a cut out side view of a portion of two conventional sub-assembly stacks that are to be subsequently used to form a printed circuit board.
Figure 3:
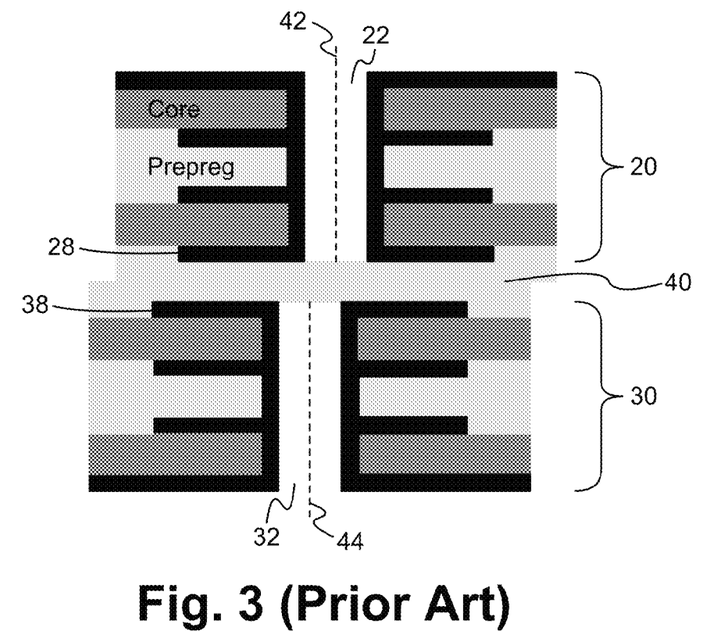
FIG. 3 illustrates the sequential lamination of the two sub-assembly stacks of FIG. 2.

In the exemplary application shown in FIG. 1, the plating 12 extends uninterrupted through the entire thickness of the via 10, thereby providing a common interconnection with each and every conductive layer 8. In other applications, it may be desired that only certain conductive layers be commonly interconnected by the plating within the via. The commonly interconnected layers are referred to as segments. Formation of segments requires a break in the via wall plating, however, the plating process that forms the plating on the via walls is commonly applied to the entire wall surface. Therefore, to form the necessary plating breaks, the printed circuit board is formed as separate sub-assembly stacks that are laminated together. Each sub-assembly laminated stack has the desired plated via, but when laminated together the plated vias from each sub-assembly laminated stack are separated by a non-conductive material that forms a break in the overall via wall plating. FIG. 2 illustrates a cut out side view of a portion of two conventional sub-assembly stacks that are to be subsequently used to form a printed circuit board. A sub-assembly laminated stack 20 includes non-conductive layers 24, 26 and conductive layers 28. The non-conductive layers 24 and the conductive layers 28 form core structures, which are laminated together with intervening non-conductive layer 26, such as prepreg. A via 22 is formed by drilling a hole through the laminated stack and plating the wall of the hole with electrically conductive material. The resulting plating interconnects the conductive layers 28. A second subassembly laminated stack 30 is similarly formed and includes a laminated stack of non-conductive layers 34, 36 and conductive layers 38, and plated via 32. To form the completed printed circuit board, the two subassemblies 20 and 30 are stacked such that the corresponding vias 22 and 32 are aligned, and laminated together with intervening non-conductive layer 40, as shown in FIG. 3. The non-conductive layer 40 provides a break in the conductive plating of via 22 and the conductive plating of via 32, thereby forming two separate segments in the printed circuit board of FIG. 3.

The process shown in FIGS. 2 and 3 is referred to as sequential lamination. A problem with sequential lamination is that it is difficult to exactly align the vias of the stacked subassemblies. As shown in FIG. 3, a via center line 42 of the via 22 in subassembly 20 is not exactly aligned with a via center line 44 of the via 32 in subassembly 30. This is known as layer to layer mis-registration and can lead to performance issues.

Figure 4:
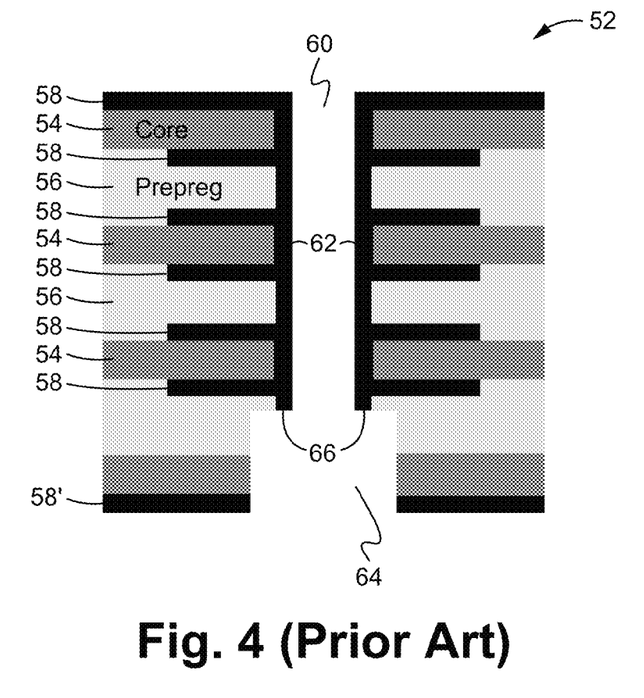
FIG. 4 illustrates a cut out side view of a portion of a conventional circuit board having the via back drilled.

In some applications, one or more of the conductive layers closest to the top or bottom surface of the printed circuit board are not designed to be interconnected to the via plating. To sever this connection for these one or more conductive layers, a back drill process is performed where the hole is drilled into the printed circuit board at the via. The hole diameter is wider than the via diameter such that the drilled hole removes the wall plating thereby removing the interconnect plating between conductive layers. FIG. 4 illustrates a cut out side view of a portion of a conventional circuit board having the via back drilled. The printed circuit board 52 is similar to the printed circuit board 2 of FIG. 1 except that a hole 64 has been back drilled into the printed circuit board 52. The back drilled hole 64 removes the corresponding portion of the plating 62 in the via 60 co-located with the bottom few layers of the printed circuit board 52. The remaining plating 62 provides an interconnect for the conductive layers 58, however, the bottom most conductive layers 58' are no longer interconnected to the conductive layers 58 since the interconnect plating 62 is removed in the hole 64. It is important that the back drilling process leaves intact the conductive layers 58, which results in a via stubs 66 extending from the last interconnected conductive layer 58. A via stub is a conductive portion of the via that is not connected in series with the electrical circuit. The longer the via stub, the greater the signal reflection and degradation. As such, it is desirable to minimize the length of the via stub. However, conventional back drilling processes have high variability and are difficult to control the length of the via stub. Additionally, back drilling is time consuming and expensive.

SUMMARY OF THE INVENTION

Embodiments are directed to a selective segment via plating process for manufacturing a circuit board having select inner layer connections as separate segments within the same via. Plating resist is plugged into an inner core through hole and then stripped off after an electroless plating process. Stripping of the electroless plating on the plating resist results in a plating discontinuity on the via wall. In a subsequent electroplating process, the inner core layer cannot be plated due to the plating discontinuity. The resulting circuit board structure has separate electrically interconnected segments within the via. The selective segment via plating process uses a single lamination step.

In an aspect, a circuit board is disclosed. The circuit board includes a laminated stack comprising a plurality of non-conducting layers and a plurality of conductive layers. The laminated stack further comprises an inner plug layer having a plating resist layer. A via is formed through the laminated stack, wherein walls of the via are plated with conductive material except where the via passes through the inner plug layer, thereby forming a via wall plating discontinuity. In some embodiments, each of the conductive layers is pattern etched. In some embodiments, the via is a single drill hole through an entirety of the laminated stack. In some embodiments, the via wall plating forms electrical interconnections with conductive layers intersecting the via, and the via wall plating discontinuity electrically isolates a first segment of electrically interconnected conductive layers from a second segment of electrically interconnected conductive layers. In some embodiments, the via wall plating comprises a first plating stub extending from the first segment and a second plating stub extending from the second segment. In some embodiments, the first plating stub has a defined stub length equal to a thickness of a non-conductive layer between the first segment and a most proximate surface of the plating resist layer. In some embodiments, the second plating stub has a defined stub length equal to a thickness of a non-conductive layer between the second segment and a most proximate surface of the plating resist layer. In some embodiments, the inner plug layer further comprises a non-conducting layer coupled to the plating resist layers In some embodiments, the circuit board further comprises a cavity extending from the via in the inner plug layer.

In another aspect, another circuit board is disclosed. The circuit board includes a laminated stack comprising a plurality of non-conducting layers and a plurality of conductive layers. The laminated stack further comprises an inner plug layer having a plating resist layer. A via is formed through the laminated stack, wherein walls of the via are plated with conductive material except where the via passes through the inner plug layer. A cavity extends from the via in the inner plug layer, wherein the cavity forms a via wall plating discontinuity. The via wall plating forms electrical interconnections with conductive layers intersecting the via, and the via wall plating discontinuity electrically isolates a first segment of electrically interconnected conductive layers from a second segment of electrically interconnected conductive layers. The via wall plating includes a first plating stub extending from the first segment to the cavity and a second plating stub extending from the second segment to the cavity. In some embodiments, each of the conductive layers is pattern etched. In some embodiments, the via is a single drill hole through an entirety of the laminated stack. In some embodiments, the first plating stub has a defined stub length equal to a thickness of a non-conductive layer between the first segment and a most proximate surface of the plating resist layer. In some embodiments, the second plating stub has a defined stub length equal to a thickness of a non-conductive layer between the second segment and a most proximate surface of the plating resist layer. In some embodiments, the inner plug layer also includes a non-conducting layer coupled to the plating resist layer.

In yet another aspect, a multiple networked structure is disclosed. The structure includes a circuit board and a pin inserted in a via of the circuit board. The circuit board includes a laminated stack comprising a plurality of non-conducting layers and a plurality of conductive layers. The laminated stack further comprises an inner plug layer having a plating resist layer. The via is formed through the laminated stack, wherein walls of the via are plated with conductive material except where the via passes through the inner plug layer, thereby forming a via wall plating discontinuity. The via wall plating forms electrical interconnections with conductive layers intersecting the via, and the via wall plating discontinuity electrically isolates a first segment of electrically interconnected conductive layers from a second segment of electrically interconnected conductive layers. The pin is inserted in the via, wherein the pin is electrically coupled to each of the first and second segments to provide an independent electrical connection from each of the first and second segments to the pin.

In still yet another aspect, a method of manufacturing a circuit board is disclosed. The method includes forming a first via through a non-conductive layer and plugging the first via with a plating resist, thereby forming a plug subassembly. The method also includes laminating a plurality of alternating non-conductive layers and conductive layers to a first surface and a second surface of the plug subassembly, thereby forming a laminated stack. The method also includes forming a second via through the laminated stack, wherein the second via passes through plating resist in the first via such that a portion of a second via wall comprises plating resist at a layer coincident with the plug subassembly within the laminated stack. The method also includes performing an electroless plating process to plate the second via wall such that a portion of the plating is formed on the portion of the second via wall comprising plating resist. The method also includes stripping the portion of the plating formed on the portion of the second via wall comprising plating resist and stripping a portion of the plating resist to form a second via wall plating discontinuity on the second via wall coincident with the plug subassembly within the laminated stack. The method also includes performing an electroplating process to further plate remaining portions of the plating on the second via wall while the second via wall plating discontinuity is maintained. In some embodiments, forming the plug subassembly further comprises applying a first conductive layer on a first surface of the non-conductive layer and applying a second conductive layer on a second surface of the non-conductive layer. In some embodiments, the first conductive layer is pattern etched and the second conductive layer is pattern etched. In some embodiments, forming the plug subassembly further comprises plating the first via prior to plugging the first via with the plating resist thereby forming an electrical interconnect between the first conductive layer and the second conductive layer. In some embodiments, the method also includes pattern etching the conductive layers in the laminated stack. In some embodiments, a diameter of the first via is larger than a diameter of the second via. In some embodiments, stripping the portion of the plating and stripping the portion of the plating resist to form the second via wall plating discontinuity forms a cavity extending from the second via, wherein the cavity is coincident with the plug assembly in the laminated stack. In some embodiments, the second via wall plating forms electrical interconnections with conductive layers intersecting the second via, and the second via wall plating discontinuity electrically isolates a first segment of electrically interconnected conductive layers from a second segment of electrically interconnected conductive layers. In some embodiments, the second via wall plating comprises a first plating stub extending from the first segment and a second plating stub extending from the second segment. In some embodiments, the first plating stub has a defined stub length equal to a thickness of a non-conductive layer between the first segment and the first surface of the plug subassembly, and the second plating stub has a defined stub length equal to a thickness of a non-conductive layer between the second segment and the second surface of the plug subassembly. In some embodiments, performing the electroplating process comprises applying electricity to the first segment and to the second segment. In some embodiments, forming the second via comprises drilling a single drill hole through an entirety of the laminated stack.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a printed circuit board. Those of ordinary skill in the art will realize that the following detailed description of the printed circuit board is illustrative only and is not intended to be in any way limiting. Other embodiments of the printed circuit board will readily suggest themselves to such skilled persons having the benefit of this disclosure.

Reference will now be made in detail to implementations of the printed circuit board as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 5:
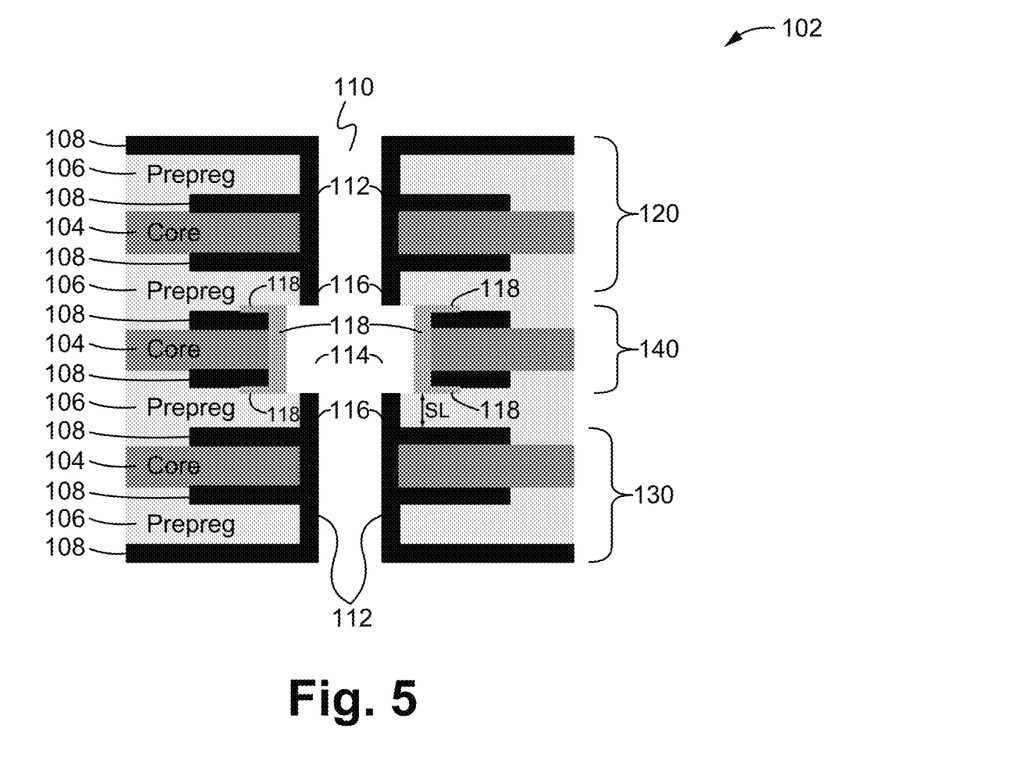
FIG. 5 illustrates a cut out side view of a portion of a printed circuit board according to an embodiment.

FIG. 5 illustrates a cut out side view of a portion of a printed circuit board according to an embodiment. The printed circuit board 102 is manufactured using a selective segment via plating process, an embodiment of which is described in relation to FIGS. 6-13. The printed circuit board 102 includes a plurality of stacked layers, the layers made of non-conductive layers 104, 106 and conductive layers 108. The non-conductive layers can be made of prepreg or base material that is part of a core structure. Each exemplary core structure shown in the laminated stack of FIG. 5 includes a non-conductive layer 104, such as a base material, and a conductive layer 108 on each surface of the non-conductive layer 104. It is understood that alternative core structures can be used which include a conductive layer on only one surface of the non-conductive layer. A plug subassembly 140 is a core structure plugged with a plating resist material. A laminated stack is formed by stacking multiple core structures and the plug subassembly with intervening prepreg and then laminating the stack. Any conventional lamination technique can be used. The exemplary laminated stack shown in FIG. 5 has two core structures. It is understood that the laminated stack can be made having more or less than two core structures. A via 110 is formed by drilling a hole through the laminated stack and plating the wall of the hole with electrically conductive material, such as copper. The resulting plating 112 interconnects select conductive layers 108. A plug subassembly 140 is selectively positioned during formation of the laminated stack to divide the printed circuit board 102 into segments 120 and 130. The plug 140 includes plating resist 118 that prohibits formation of the plating 112 in cavity or void 114 during the plating process. As a result, the plating 112 in the segment 120 is disconnected from the plating 112 in the segment 130. This results in the via 110 have two electrically isolated segments 120 and 130. A segment can also be referred to as a net, which is an electrical sub-circuit. Each segment provides an independent electrical connection to a pin inserted into the via. As such, the printed circuit board having multiple segments is a multi-net structure.

In this embodiment, portions of the plating 112, referred to as stubs 116, are left extending from the conducting layers most proximate the void 114. The stubs 116 have a well defined and short stub length SL which is defined as the distance between the conductive layer 108 most proximate the void 114 and the remaining plating resist 118.

The number of layers in the PCB 102 and the position of the plug 140 within the laminated stack shown in FIG. 5 is for exemplary purposes only. The selective segment via plating process allows freedom in interconnecting various sequential inner conductive layers as separate segments within the same via. In the exemplary configuration shown in FIG. 5, the top three conductive layers are interconnected as one segment, and the bottom three conductive layers are interconnected as another segment. It is understood that not all segments need have the same number of interconnected conductive layers. It is also understood that a segment can have more or less than three interconnected conductive segments. In the exemplary configuration shown in FIG. 5, a single plug 140 is interspersed within the printed circuit board 102. Alternatively, multiple such plugs can be interspersed within the printed circuit board. Inclusion of additional plugs results in additional segments being formed.

Figure 6:
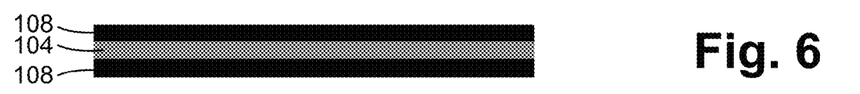
FIGS. 6-13 illustrate various steps in the selective segment via plating process used to manufacture the printed circuit board in FIG. 5.

FIGS. 6-13 illustrate various steps in the selective segment via plating process used to manufacture the printed circuit board 102 in FIG. 5. Each of the FIGS. 6-13 illustrates a cut out side view of the printed circuit board according to the various process steps. In FIG. 6, an exemplary core structure is shown. The core structure is a metal clad base material including a non-conductive base material layer 104 and conductive layers 108 formed on both opposing surfaces. It is understood that an alternative core structure can be used which includes a conductive layer on only one surface of the non-conductive layer.

Figure 7:
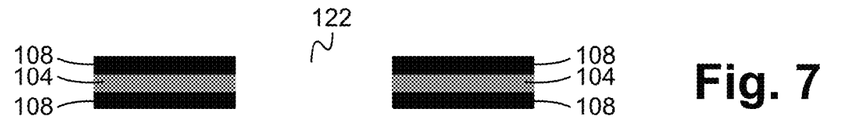
Figure 8:
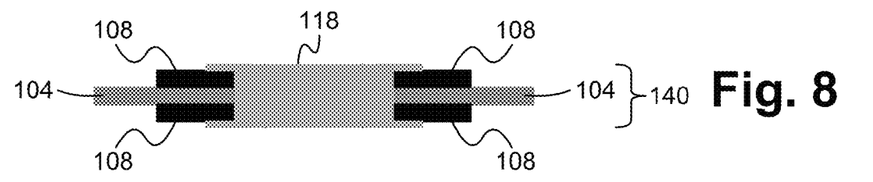

In FIG. 7, a hole is drilled through the conductive layers 108 and the core layer 104 to form a via 122. In some embodiments, the walls of the via 122 are plated, such as with copper. In FIG. 8, the conductive layers 108 are pattern etched to form conductive interconnects as desired. Alternatively, the conductive layers 108 are already pattern etched during fabrication of the core structure in FIG. 6. The via 122 is then plugged with plating resist 118, such as liquid photoimageable plating resist. It is understood that other types of plating resist can be used that are resistant to a subsequent via wall plating step. In some embodiments, a portion of the plating resist 118 overlaps a portion of the conductive layers 108 surrounding the via 122. The resulting structure forms the basis for the plug 140.

Figure 9:
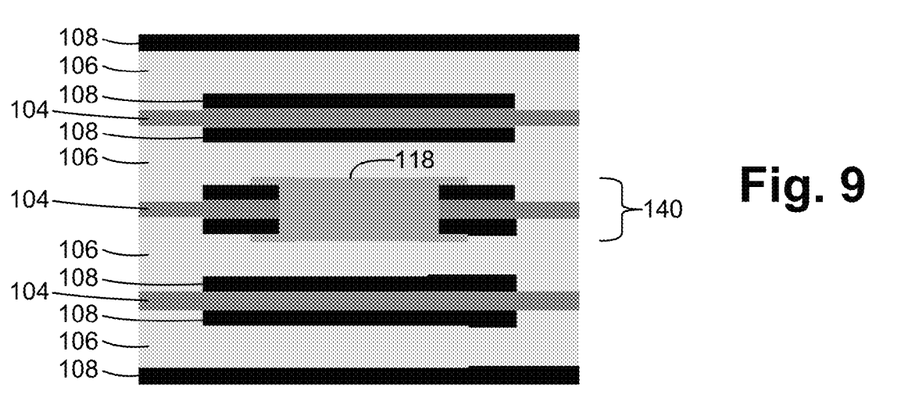

In FIG. 9, multiple core structures are fabricated, and the core structures and the plug subassembly are stacked with intervening non-conductive layers 106. In the exemplary configuration shown in FIG. 9, additional conductive layers 108 and intervening non-conductive layers 106 are added to the top and bottom of the stack. A single lamination step results in the laminated stack shown in FIG. 9. The additional conductive layers 108 on the top and bottom of the laminated stack are pattern etched.

Figure 10:
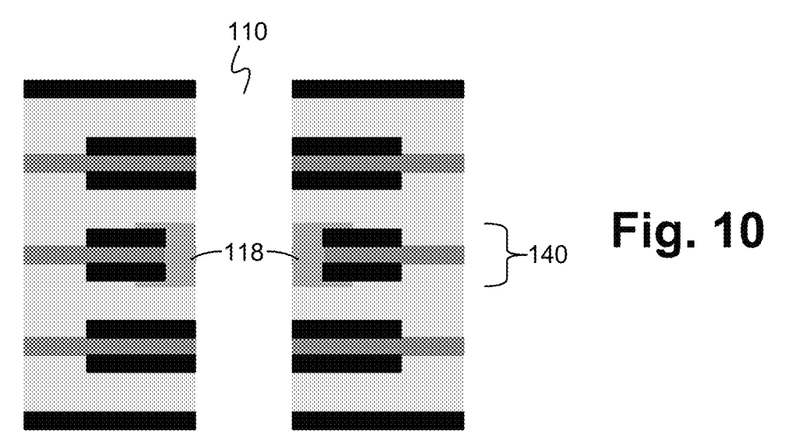

In FIG. 10, a hole is drilled through the laminated stack of FIG. 9 to form via 110. A diameter of the via 110 is smaller than a diameter of the via 122 (FIG. 7) that is plugged with plating resist 118. As a result, formation of the via 110 leaves a layer of plating resist 118 on the side wall of the via 110 in the area of the plug 140.

Figure 11:
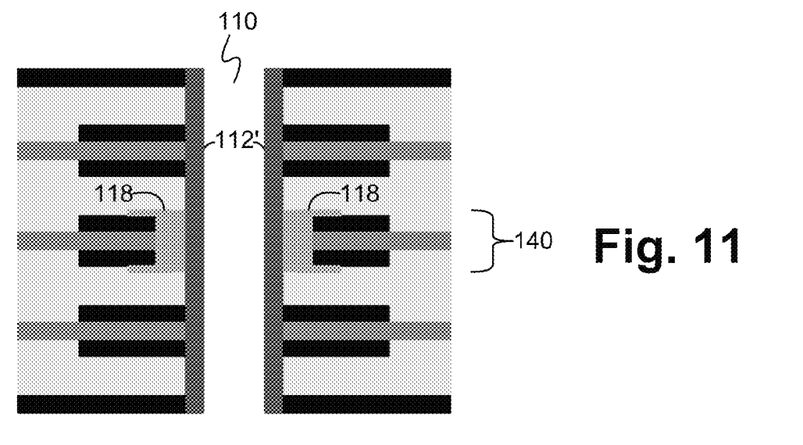

In FIG. 11, a desmear process is performed to remove residue, such as residual particles from the drilling of via 110. Next, an electroless plating process is performed to form plating 112' on the side walls of the via 110. In some embodiments, copper is used as the plating material. It is understood that other plating materials can be used. The plating 112' forms an interconnect with the various conductive layers 108, except within the area of the plug 140 where the plating resist 118 provides a barrier. In the area of the plug 140, the plating 112' is formed on the plating resist 118.

Figure 12:
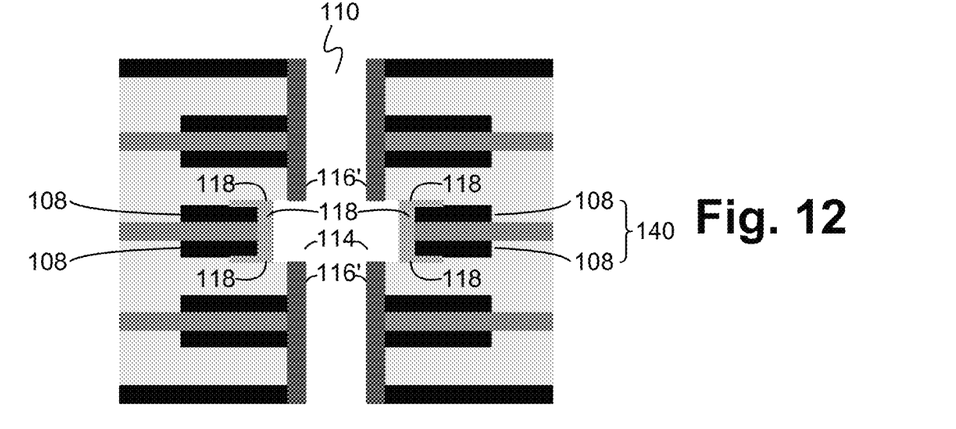

In FIG. 12, a plating resist stripping process is performed. During the plating resist stripping process, both the plating 112' in the area of the plug 140 and a portion of the plating resist material 118 is removed. The plating 112' deposited during the electroless plating process in FIG. 11 does not deposit well onto the plating resist 118 and therefore the plating resist 118 is not completely covered by the plating 112'. Also, the adhesion bond between the plating 112' and the plating resist 118 is not as strong as the adhesion bond between the plating 112' and the other layers exposed in the via. As such, during the plating resist stripping process, the stripping chemistry attacks the plating resist 118 at locations lacking coverage by the plating 112'. As the plating resist 118 dissolves, there is no support for the portion of the plating 112' deposited on the plating resist 118 and this portion of the plating 112' is removed. A residual amount of plating resist 118 remains after the plating resist stripping step. Stripping of the portion of the plating 112' in the plug area 140 results in a cavity surrounding the via and a void 114 in the plating 112'. This discontinuity in the plating 112' results in the formation of plating stubs 116'. However, the stubs 116' are disconnected from the conductive layers 108 in the plug area 140, as shown in FIG. 12. The conductive layers 108 within the plug area 140 are recessed from the via 110.

Figure 13:
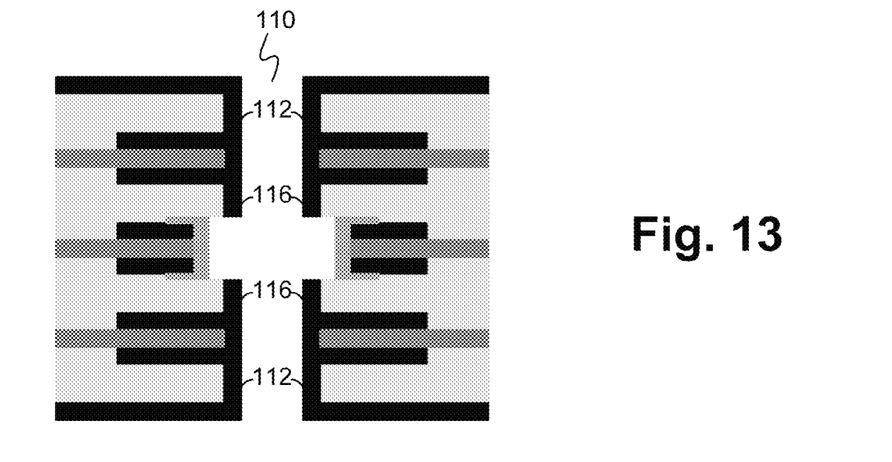

In FIG. 13, an electroplating process is performed resulting in a thicker plating 112 on the side walls of the via 110. In some embodiments, copper is used as the plating material. As the exposed surfaces in the void 114 are not electrically connected, there is no plating on the exposed surfaces during the electroplating process, resulting in electrically isolated segments 120 and 130.

Figure 14:
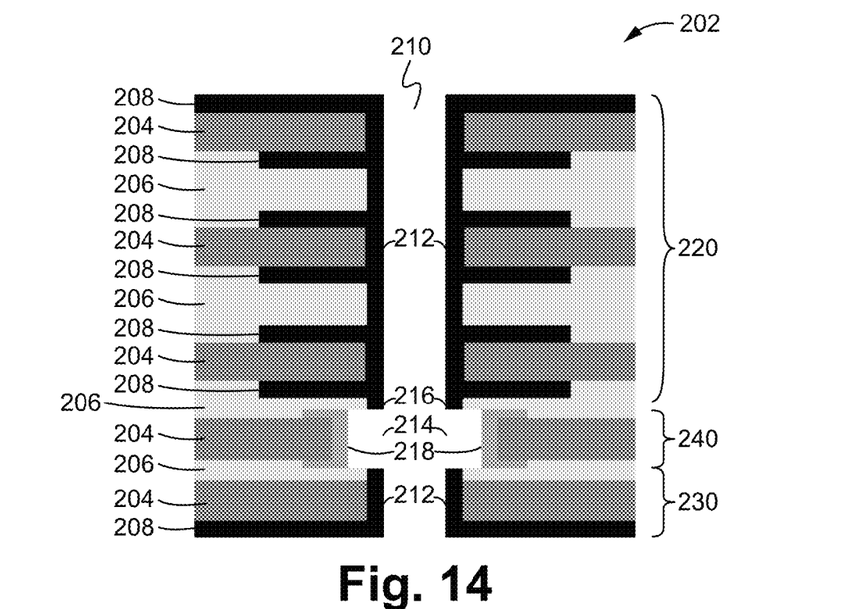
FIG. 14 illustrates a cut out side view of a portion of a printed circuit board according to another embodiment.

In some embodiments, the plug is formed without conductive layers. In this case, a via is drilled into a layer of the core structure non-conductive layer, and the via is plugged with the plating resist. A portion of the plating resist may or may not overlap the core structure non-conductive layer surrounding the via. FIG. 14 illustrates a cut out side view of a portion of a printed circuit board according to another embodiment. The printed circuit board 202 includes a plurality of stacked layers, the layers made of non-conductive layers 204, 206 and conductive layers 208 laminated to a plug 240 to form a laminated stack with plated via 210 in a similar manner as previously described. In contrast to the previous embodiments, the plug 240 is formed without conductive layers coupled to either opposing surface of a core structure non-conductive layer. The plug 240 is formed similarly as the plug 140 in FIGS. 6-8 but without the inclusion of the conductive layers. The resulting plug 240 is a core structure non-conductive layer having a plating resist filled via. In the exemplary embodiment shown in FIG. 14, the plating resist stripping step does not entirely remove all of the plating resist 218, only enough to form voids 214. As a result, plating 212 does not form in the recessed area of the void 214 during the subsequent electroplating step.

FIG. 14 also illustrates an additional functionality where the plug is selectively positioned toward the "back" of the printed circuit board, thereby effectively isolating a select number of conductive layers at the back side, for example segment 230, from the segment 220 in a manner similar to back drilling. However, in the case of the selective segment via plating process, the lengths of the resulting stubs 216 are well defined and are greatly minimized in length relative to the back drilling process.

Figure 15:
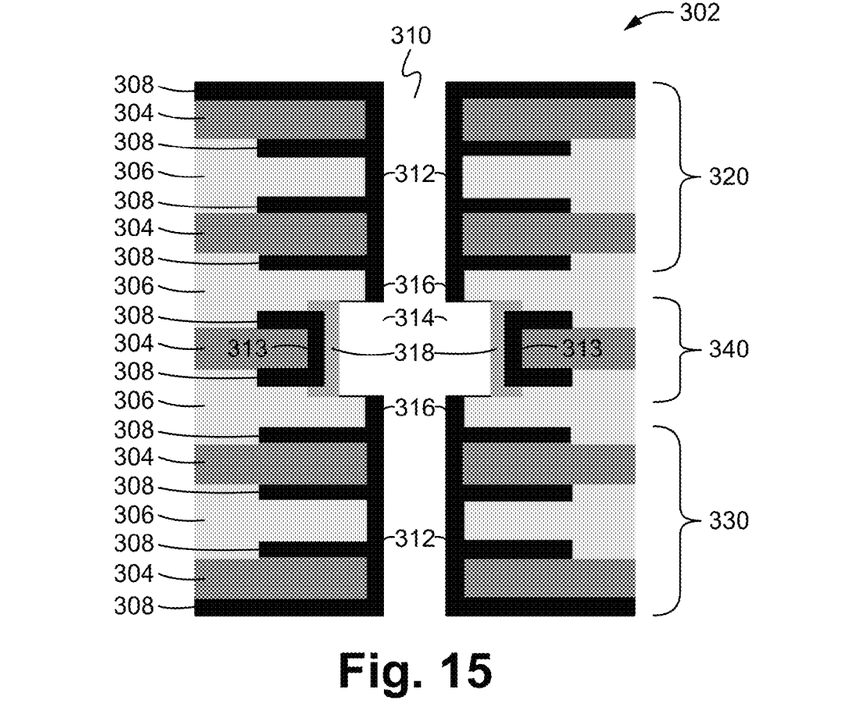
FIG. 15 illustrates a cut out side view of a portion of a printed circuit board according to yet another embodiment.

As mentioned above, the plug subassembly can be configured to include plating on the side wall of the via. In this embodiment, the plug can function as a separate segment. FIG. 15 illustrates a cut out side view of a portion of a printed circuit board according to yet another embodiment. The printed circuit board 302 includes a plurality of stacked layers, the layers made of non-conductive layers 304, 306 and conductive layers 308 laminated to a plug 340 to form a laminated stack with plated via 310 in a similar manner as previously described. In this embodiment, the plug 340 is formed similarly as the plug 140 in FIGS. 6-8 except that the via in the plug is first plated before being plugged with plating resist. The resulting plug 340 includes plating 313 that forms an interconnect with the conductive layers 308 of the plug 340. The plating resist stripping step does not entirely remove all of the plating resist 318, only enough to form voids 314. As a result, plating 312 does not form in the recessed area of the void 314 during the subsequent eletroplating step, and as such electrically isolated segments 320 and 330 are formed. Also, since the conductive layers 308 in the area of the plug 340 are electrically interconnected by plating 313, the conductive layers in the plug 340 form an electrically isolated segment.

It is understood that the various structural configurations and the position of the plugs shown in the embodiments of FIGS. 6-15 can be interchanged according to a specific application and application requirement.

The selective segment via plating process allows freedom in connecting innerlayers as separate segments within a via. The selective segment via plating process can replace back drill and sequential lamination processes while achieving the same design as these two processes. This saves running cost and shortens PCB processing time. Compared to uncontrollable stub length in the conventional back drill process, the selective segment via plating process provides for controlled and reproducible stub length which is important in signal transfer integrity. A plating stub is a conductive portion of the via plating not connected in series with the circuit. By making it shorter, signal reflection and degradation can be minimized as signal travels along the via. Elimination of a back drilling step also conserves useable real estate on the printed circuit board as the physical size of the drill bit requires additional spacing of adjacently drilled holes. Compared to sequential lamination, the selective segment via plating process requires a single assembly lamination which gives exact via alignment through the entire thickness of the printed circuit board, which provides better overall layer to layer registration and hence more room for circuitry routing. The selective segment via plating process also enables a one-time drilling step.

The present application has been described in terms of specific embodiments incorporating details to facilitate the understanding of the principles of construction and operation of the flexible printed circuits having attached rigid components. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A circuit board comprising:
  a laminated stack comprising a plurality of non-conductive layers and a plurality of conductive layers, wherein the laminated stack further comprises an inner plug subassembly comprising a plating resist, the inner plug subassembly stacked within an interior of the laminated stack;
  a via formed through the laminated stack, wherein via side walls define a via diameter, and the via side walls are plated with conductive material except where the via passes through the inner plug subassembly, thereby forming a via side wall plating discontinuity, wherein a surface of the via side wall plating facing into the via defines a plated via diameter that is less than the via diameter; and
  a cavity extending transversely from a longitudinal axis of the via at a same layer within the lamented stack as the inner plug subassembly, the cavity defined by cavity side walls that are recessed from the via side walls and by top and bottom surfaces corresponding to layers of the laminated stack adjacently laminated to both sides of the inner plug subassembly, wherein the cavity side wall comprises the plating resist.

2. The circuit board of claim 1 wherein each of the conductive layers is pattern etched.

3. The circuit board of claim 1 wherein the via comprises a single drill hole through an entirety of the laminated stack.

4. The circuit board of claim 1 wherein the via side wall plating forms electrical interconnections with conductive layers intersecting the via, and the via side wall plating discontinuity electrically isolates a first segment of electrically interconnected conductive layers from a second segment of electrically interconnected conductive layers.

5. The circuit board of claim 4 wherein the via side wall plating comprises a first plating stub extending from the first segment and a second plating stub extending from the second segment.

6. The circuit board of claim 5 wherein the first plating stub has a defined stub length equal to a thickness of a non-conductive layer between the first segment and a most proximate surface of the inner plug subassembly.

7. The circuit board of claim 5 wherein the second plating stub has a defined stub length equal to a thickness of a non-conductive layer between the second segment and a most proximate surface of the inner plug subassembly.

8. The circuit board of claim 1 wherein the inner plug subassembly comprises a first surface and a second surface opposite the first surface, an inner plug subassembly via extending from the first surface to the second surface, and the inner plug subassembly via completely filled with plating resist, wherein the inner plug subassembly via has a diameter that is greater than the via diameter, and the via through the printed circuit board is aligned within the inner plug subassembly via diameter.

9. The circuit board of claim 8 wherein the first surface of the inner plug subassembly is laminated to first non-conducting layer in the laminated stack and the second surface of the inner plug subassembly is laminated to a second non-conducting layer in the laminated stack.

10. A circuit board comprising:
  a laminated stack comprising a plurality of non-conductive layers and a plurality of conductive layers, wherein the laminated stack further comprises an inner plug subassembly comprising a plating resist, the inner plug subassembly stacked within an interior of the laminated stack;
  a via formed through the laminated stack, wherein via side walls define a via diameter, and the via side walls are plated with conductive material except where the via passes through the inner plug subassembly, wherein a surface of the via side wall plating facing into the via defines a plated via diameter that is less than the via diameter; and
  a cavity extending transversely from a longitudinal axis of the via at a same layer within the lamented stack as the inner plug subassembly, the cavity defined by cavity side walls that are recessed from the via side walls and by top and bottom surfaces corresponding to layers of the laminated stack adjacently laminated to both sides of the inner plug subassembly, wherein the cavity side wall comprises the plating resist, wherein the cavity forms a via side wall plating discontinuity, further wherein the via side wall plating forms electrical interconnections with conductive layers intersecting the via, and the via side wall plating discontinuity electrically isolates a first segment of electrically interconnected conductive layers from a second segment of electrically interconnected conductive layers, wherein the via side wall plating comprises a first plating stub extending from the first segment to the cavity and a second plating stub extending from the second segment to the cavity.

11. The circuit board of claim 10 wherein each of the conductive layers is pattern etched.

12. The circuit board of claim 10 wherein the via comprises a single drill hole through an entirety of the laminated stack.

13. The circuit board of claim 10 wherein the first plating stub has a defined stub length equal to a thickness of a non-conductive layer between the first segment and a most proximate surface of the inner plug subassembly.

14. The circuit board of claim 10 wherein the second plating stub has a defined stub length equal to a thickness of a non-conductive layer between the second segment and a most proximate surface of the inner plug subassembly.

15. The circuit board of claim 10 wherein the inner plug subassembly comprises a first surface and a second surface opposite the first surface, an inner plug subassembly via extending from the first surface to the second surface, and the inner plug subassembly via completely filled with plating resist, wherein the inner plug subassembly via has a diameter that is greater than the via diameter, and the via through the printed circuit board is aligned within the inner plug subassembly via diameter.

16. The circuit board of claim 15 wherein the first surface of the inner plug subassembly is laminated to first non-conducting layer in the laminated stack and the second surface of the inner plug subassembly is laminated to a second non-conducting layer in the laminated stack.

* * * * *